(12) United States Patent
Hong (10) Patent No.: US 7,763,925 B2
(45) Date of Patent: Jul. 27, 2010

(54) SEMICONDUCTOR DEVICE INCORPORATING A CAPACITOR AND METHOD OF FABRICATING THE SAME

(75) Inventor: Jun-Pyo Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 543 days.

(21) Appl. No.: 11/807,466

(22) Filed: May 29, 2007

(65) Prior Publication Data

US 2007/0278620 A1    Dec. 6, 2007

(30) Foreign Application Priority Data

May 30, 2006  (KR)  ............... 10-2006-0048948

(51) Int. Cl.
*H01L 27/108* (2006.01)
(52) U.S. Cl. ............... 257/307; 257/301; 257/E21.016; 257/E21.019; 438/386; 438/393; 361/306.3; 361/328; 361/330
(58) Field of Classification Search ............... 438/171, 438/190, 238, 239, 386, 393; 257/301, 307, 257/532, E21.016, E21.019; 361/306.3, 361/308.1, 328, 330
See application file for complete search history.

(56) References Cited

U.S. PATENT DOCUMENTS

| 6,383,858 | B1 | 5/2002 | Gupta et al. | |
|---|---|---|---|---|
| 6,794,702 | B2 | 9/2004 | Park | |
| 6,847,077 | B2 * | 1/2005 | Thomas et al. | 257/301 |
| 6,949,811 | B2 * | 9/2005 | Miyazawa | 257/532 |
| 7,202,548 | B2 * | 4/2007 | Lee | 257/532 |
| 2004/0021223 | A1 | 2/2004 | Park | |

FOREIGN PATENT DOCUMENTS

| JP | 11-163265 | 6/1999 |
|---|---|---|
| JP | 2004-349526 | 9/2004 |
| KR | 2003-0002668 | 9/2003 |
| KR | 10-2004-0011251 | 2/2004 |
| KR | 10-2005-0112907 | 12/2005 |
| KR | 10-2006-0061039 | 6/2006 |

* cited by examiner

*Primary Examiner*—Matthew C Landau
*Assistant Examiner*—Colleen E Snow
(74) *Attorney, Agent, or Firm*—Mills & Onello, LLP (57) ABSTRACT

A semiconductor device incorporating a capacitor and a method of fabricating the same include a first inter-layer dielectric film formed on a semiconductor substrate, a first electrode pattern formed on the first inter-layer dielectric film, and a capacitor region self-aligned to the first electrode pattern and in which the first inter-layer dielectric film is etched. An MIM capacitor is conformably formed on the sidewall of the first electrode pattern in the capacitor region. In the capacitor region, a first hollow region is formed enclosed by the MIM capacitor and a second electrode pattern fills the first hollow region. The second electrode pattern has a sidewall opposite to the sidewall of the first electrode pattern. The MIM capacitor is conformably formed in the capacitor region that is deepened more than a thickness of an interconnection layer, so that it has a capacitor area wider than an area contacting with the interconnection layer. Further, the MIM capacitor can be enlarged in area by transforming a planar form of the electrode pattern.

24 Claims, 13 Drawing Sheets

Fig. 1

(PRIOR ART)

SEMICONDUCTOR DEVICE INCORPORATING A CAPACITOR AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2006-0048948 filed in the Korean Intellectual Property Office on May 30, 2006, the entire contents of which are hereby incorporated by reference.

BACKGROUND

The present invention described herein relates to semiconductor device technology and more particularly, to a semiconductor device incorporating a capacitor and a method of fabricating the same.

Capacitors using metal electrodes are regarded as suitable for applications requiring high frequency operation, rather than capacitors using polysilicon electrodes. The polysilicon electrodes have drawbacks caused by low capacitance by oxidation of parts that contact dielectric films and degradation of capacitance by generation of parasitic capacitance due to ionic depletion.

Metal-insulator-metal (MIM) capacitors are mostly employed in high-performance semiconductor devices because they have small resistivity, without depletion capacitance, and are suitable for high frequency operation.

Figure 1:
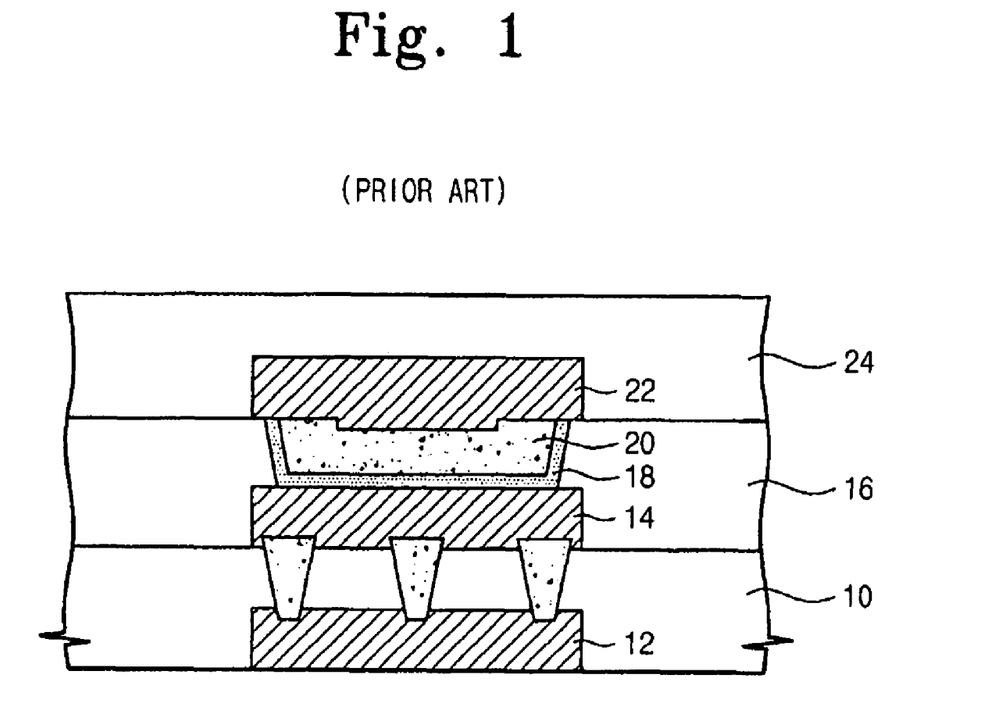
FIG. 1 is a sectional view illustrating a general conventional capacitor of a semiconductor device.

FIG. 1 is a schematic diagram of a general conventional MIM capacitor.

Referring to FIG. 1, an MIM capacitor includes a bottom electrode 14 connected to a lower interconnection 12 included in a lower dielectric film 10. An inter-layer dielectric film 16 covers the bottom electrode 14. The bottom electrode 14 corresponds to a portion of multi-level interconnections in a semiconductor device.

The inter-layer dielectric film 16 is partially etched to expose the bottom electrode 14 in the capacitor region. A dielectric film 18 is conformably formed in the capacitor region. A metal with a good filling characteristic, such as tungsten (W), is provided on the dielectric film 18, forming a top electrode 20. The top electrode 20 is connected to an upper interconnection layer 22 covered by an upper dielectric film 24 formed on the inter-layer dielectric film 16.

As stated, a conventional MIM capacitor is characterized in a structure that the lower electrode is used with a portion of the interconnection layer and the top electrode fills the capacitor region. Thus, the dielectric film extends in area because it is formed on the sidewall and bottom of the capacitor region, but an effective area between the top and bottom electrodes 14 and 20 is relatively small. Although it is desirable to increase a planar area of the electrode, there is a limit to the amount of area that may be occupied by the capacitor in a semiconductor device.

SUMMARY OF THE INVENTION

The present invention provides a semiconductor device incorporating a capacitor with relatively large capacitance in a restrictive area.

The present invention is also provides a semiconductor device incorporating a capacitor with an area larger than a surface area of an interconnection layer coupled thereto.

The present invention provides a semiconductor device having an MIM capacitor interposed between conductive patterns, and a method of fabricating the same. In an aspect of the present invention, the semiconductor device includes a first inter-layer dielectric film formed on a semiconductor substrate, a first electrode pattern formed on the first inter-layer dielectric film, and a first capacitor region in which the first inter-layer dielectric film is etched in self-alignment to the first electrode pattern. A first metal-insulator-metal (MIM) capacitor is conformably formed in the first capacitor region on a sidewall of the first electrode pattern and on the surface of the first capacitor region to form a first hollow region enclosed thereby. A second electrode pattern fills the first hollow region. The second electrode pattern has a sidewall opposite to a sidewall of the first electrode pattern.

The first MIM capacitor may be formed with plurality in a stacked structure. In this case, the stacked MIM capacitors are coupled to each other in parallel, offering high capacitance without increasing a planar area.

In an embodiment, the stacked capacitor structure includes a second inter-layer dielectric film covering the second electrode pattern. Between the electrode patterns are interposed the MIM capacitors.

In one embodiment, the first MIM capacitor comprises a bottom electrode, a capacitor dielectric film, and a top electrode. The bottom electrode can be connected to the first electrode pattern and the top electrode can be connected to the second electrode pattern.

The semiconductor device can further include a first etch stop film formed under the first inter-layer dielectric film, having an etch selectivity to the first inter-layer dielectric film. The first MIM capacitor can contact with the first etch stop film through the first inter-layer dielectric film.

In one embodiment, the first inter-layer dielectric film comprises a first lower inter-layer dielectric film and a first upper inter-layer dielectric film. The first electrode pattern can be formed on the first lower inter-layer dielectric film, and the first upper inter-layer dielectric film can be formed on the first lower inter-layer dielectric film and flattened in alignment to the top surface of the first electrode pattern.

In one embodiment, in a vertical view to the semiconductor substrate, the first MIM capacitor is interposed between the first electrode pattern and the second electrode pattern engaging each other.

In one embodiment, in a vertical view to the semiconductor substrate, the first electrode pattern and the second electrode pattern are configured in plural fingers extending in parallel in linear forms, the fingers of the first electrode pattern and the second electrode pattern being alternately arranged and opposite to each other.

In one embodiment, in a vertical view to the semiconductor substrate, the first electrode pattern is configured in plural fingers bidirectionally extending in linear forms, and the second electrode pattern is configured in pluralities of lines alternately arranged with the fingers of the first electrode pattern.

In one embodiment, in a vertical view to the semiconductor substrate, the first and second electrode patterns are configured in spiral forms extending in parallel.

In one embodiment, the semiconductor device further includes: a first interconnection layer formed on the same level with the first electrode pattern; a second inter-layer dielectric film covering the first electrode pattern, the second electrode pattern, and the first interconnection layer; and a second interconnection layer formed on the second inter-layer dielectric film.

In one embodiment, the first interconnection layer is connected to the first electrode pattern. The second interconnection layer comprises a first interconnection pattern connected to the first interconnection layer, and a second interconnection pattern connected to the second electrode pattern.

In one embodiment, the semiconductor device further includes: a third electrode pattern formed on the same level with the second interconnection layer; a second capacitor region where the second inter-layer dielectric film is etched in self-alignment to the third electrode pattern; a second MIM capacitor conformably formed on a sidewall of the third electrode pattern and the surface of the second capacitor region to define a second hollow region; and a fourth electrode pattern filling the second hollow region to have a sidewall opposite to a sidewall of the third electrode pattern.

In one embodiment, the first and second MIM capacitors are connected to each other in parallel.

In one embodiment, the semiconductor device further includes: a third inter-layer dielectric film covering the third electrode pattern, the fourth electrode pattern and the second interconnection layer; and a third interconnection layer formed on the third inter-layer dielectric film.

In one embodiment, the first interconnection layer is connected to the first electrode pattern. The second interconnection layer includes a first interconnection pattern connected to the first interconnection layer and the third electrode pattern, and a second interconnection pattern connected to the second electrode pattern. The third interconnection layer includes a third interconnection pattern connected to the first interconnection pattern, and a fourth interconnection pattern connected to the fourth electrode pattern and the second interconnection pattern.

In one embodiment, the third electrode pattern is placed over the second electrode pattern and the fourth electrode pattern is placed over the first electrode pattern.

In one embodiment, the third electrode pattern is placed over the first electrode pattern and the fourth electrode pattern is placed over the second electrode pattern.

In one embodiment, the semiconductor device further includes: a second etch stop film formed under the second inter-layer dielectric film, having etch selectivity to the second inter-layer dielectric film. The second MIM capacitor contacts with the second etch stop film through the second inter-layer dielectric film.

In one embodiment, the semiconductor device further includes: the first inter-layer dielectric film comprises first lower and upper inter-layer dielectric films while the second inter-layer dielectric film comprises second lower and upper inter-layer dielectric films. The first and third electrode patterns are formed respectively on the first and second lower inter-layer dielectric films while the first and second upper inter-layer dielectric films are flattened in alignment each to the tops of the first and third electrode patterns.

In another aspect of the present invention, a method of fabricating a semiconductor device is comprised of forming a first inter-layer dielectric film on a semiconductor substrate, and forming a first electrode pattern on the first inter-layer dielectric film. The first inter-layer dielectric film is etched in self-alignment with the first electrode pattern, forming a first capacitor region. A first metal-insulator-metal (MIM) capacitor is conformably formed on a sidewall of the first electrode pattern and the surface of the first capacitor region, defining a first hollow region. Subsequently, a second electrode pattern is formed to fill the first hollow region and include a sidewall opposite to the sidewall of the first electrode pattern.

In an embodiment, forming the first MIM capacitor is comprised of conformably forming an first MIM capacitor layer over a surface of the semiconductor substrate including the first capacitor region and defining the first hollow region. A second electrode pattern film is formed to fill the first hollow region on the first MIM capacitor layer. Then, the second electrode pattern film and the first MIM capacitor layer are flattened and partially removed from the first inter-layer dielectric film and the first electrode pattern. As a result, the second electrode pattern is formed from a remaining portion of the second electrode film in the hollow region defined by the MIM capacitor.

In one embodiment, forming the first inter-layer dielectric film comprises: forming a first lower inter-layer dielectric film before forming the first electrode pattern; forming a first upper inter-layer dielectric film covering the first electrode pattern and the lower inter-layer dielectric film; and flattening the first upper inter-layer dielectric film to align with the top surface of the first electrode pattern.

In one embodiment, the method further comprises, simultaneously with forming the first electrode pattern, forming a first interconnection layer electrically connected to the first electrode pattern on the lower inter-layer dielectric film.

In one embodiment, the method further comprises: forming a second inter-layer dielectric film on a surface of the semiconductor substrate after forming the second electrode pattern; and forming a second interconnection layer on the second inter-layer dielectric film, the second interconnection layer penetrating the second inter-layer dielectric film and being connected to the first interconnection layer and the second electrode pattern. The second interconnection layer includes a first interconnection pattern connected to the first interconnection layer, and a second interconnection pattern connected to the second electrode pattern.

In one embodiment, the method further comprises: forming a first etch stop film having etch selectivity to the first inter-layer dielectric film before forming the first inter-layer dielectric film.

In one embodiment, the method further comprises: etching the first inter-layer dielectric film and exposing the first etch stop film while forming the first capacitor region.

In one embodiment, the method further comprises: forming a third electrode pattern on the second inter-layer dielectric film simultaneously with-forming the second interconnection layer; etching the second inter-layer dielectric film in self-alignment to the third electrode pattern and forming a second capacitor region; conformably forming a second MIM capacitor on a sidewall of the third electrode pattern in the second capacitor region and defining a second hollow region; and forming a fourth electrode pattern to fill the second hollow region and include a sidewall opposite to the sidewall of the third electrode pattern.

In one embodiment, the method further comprises: forming a third inter-layer dielectric film covering the third electrode pattern, the fourth electrode pattern, and the second interconnection layer; and forming a third interconnection layer on the second inter-layer dielectric film. The third interconnection layer includes a third interconnection pattern connected to the first interconnection pattern, and a fourth interconnection pattern connected to the fourth electrode pattern and the second interconnection pattern.

A further understanding of the nature and advantages of the present invention herein may be realized by reference to the remaining portions of the specification and the attached drawings.

BRIEF DESCRIPTION OF THE FIGURES

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Moreover, the description hereinbelow uses terms of first, second, or third for representing pluralities of various regions or films, those terms are employed to differentiate one from another, not restrictive thereto. In a certain case, a first region or film may be referred to as a second region or film in another embodiment. And, embodiments described herein may include their complementary cases.

Figure 2A:
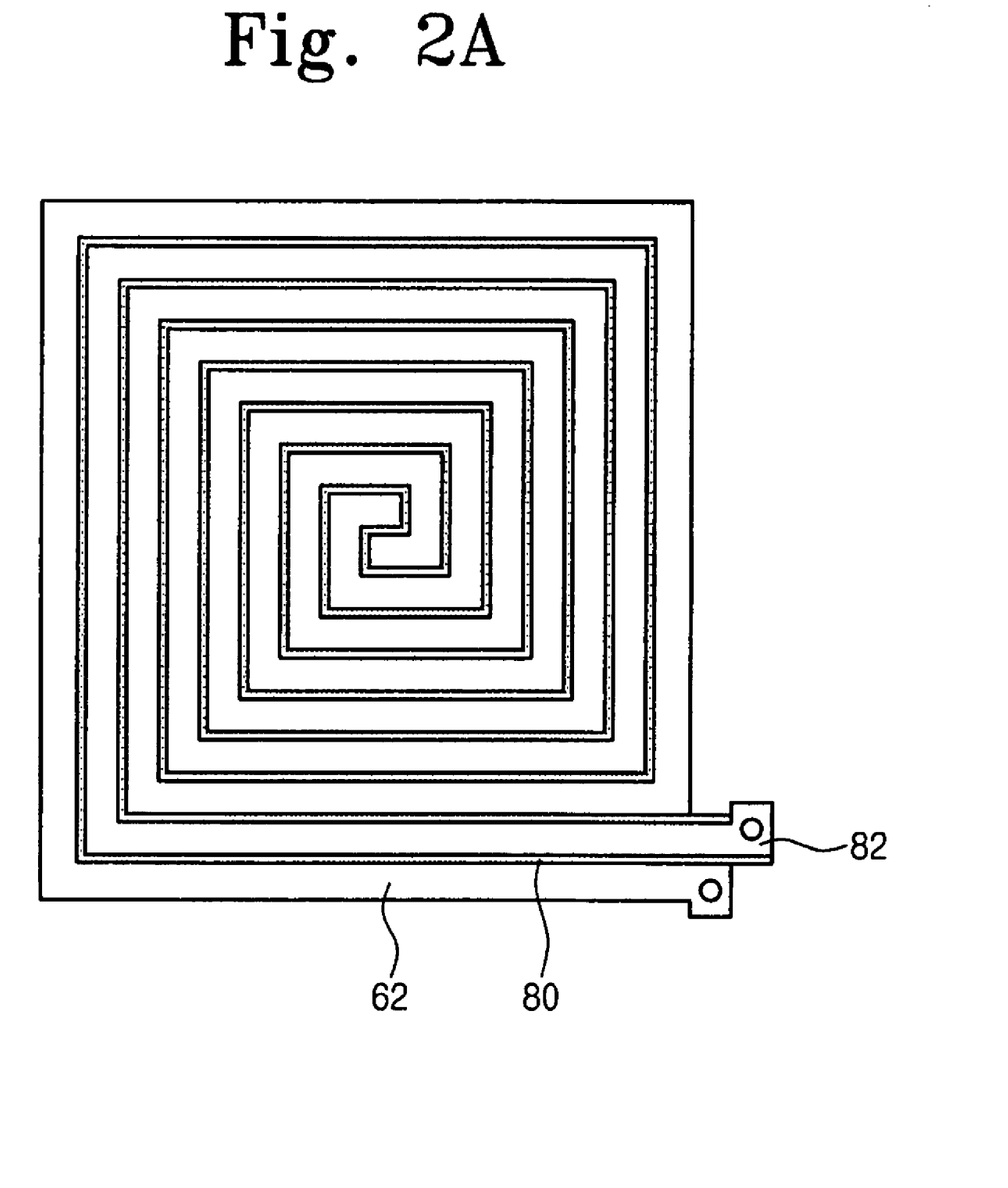
FIGS. 2A through 2C are plane views illustrating capacitors in accordance with embodiments of the present invention.
Figure 2B:
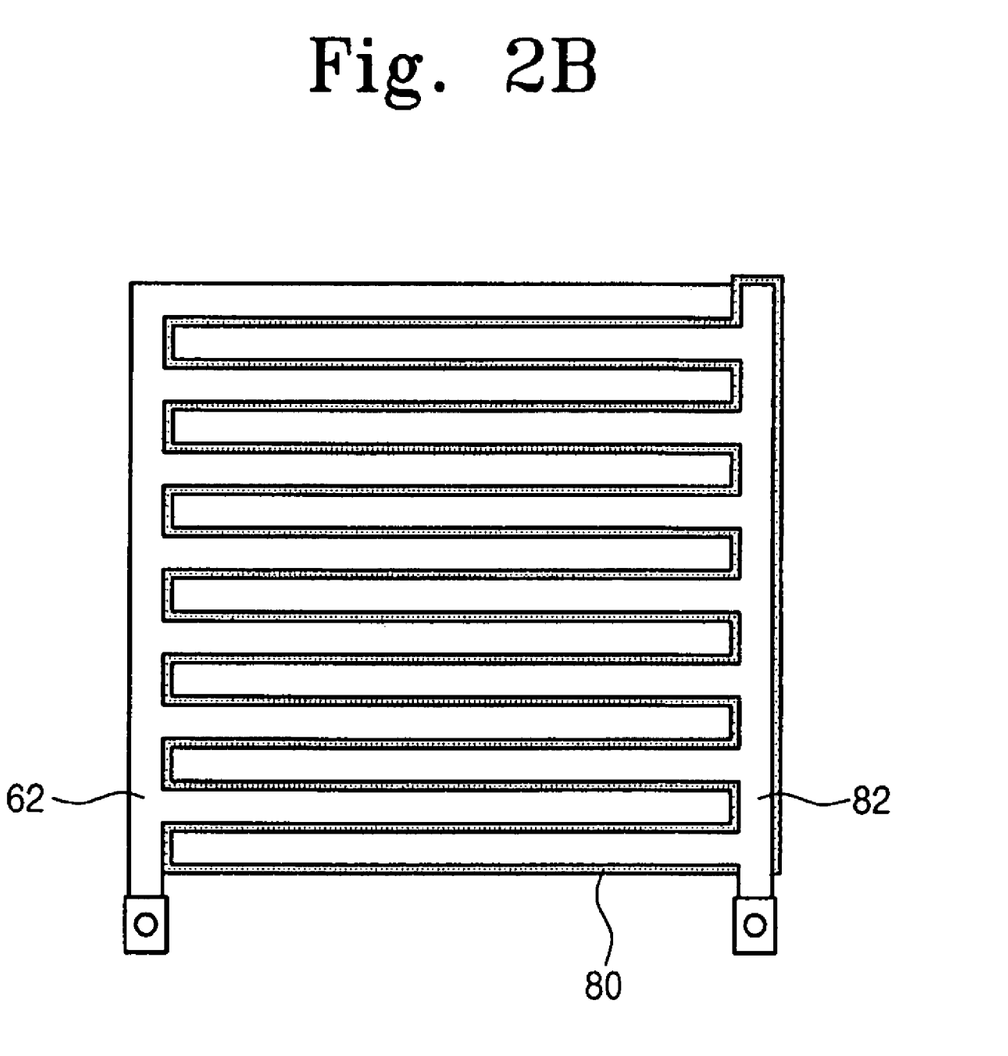
Figure 2C:
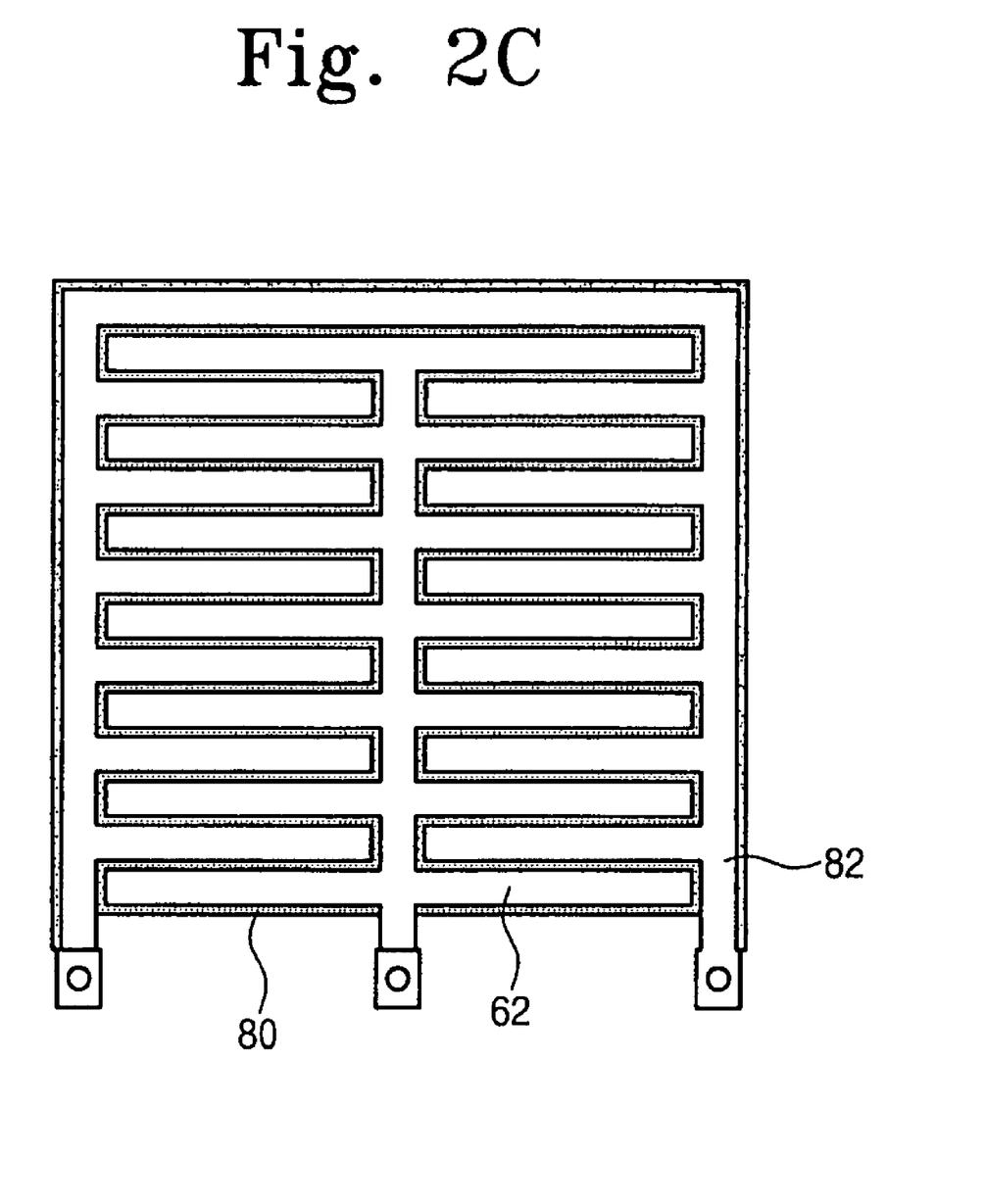

FIGS. 2A through 2C are plane views illustrating capacitors in accordance with embodiments of the present invention.

Referring to FIG. 2A, in a view vertical to a semiconductor substrate, a capacitor structure may be structured in a spiral pattern. The capacitor structure includes first and second electrode patterns 62 and 82. Between the first and second electrode patterns 62 and 82 is interposed an MIM capacitor 80.

The first and second electrode patterns 62 and 82 extend substantially in parallel with each other in the spiral pattern. The MIM capacitor 80 is formed continuously extending to the bottom from the sidewall of the second electrode pattern 82, defining a hollow region filled up with the second electrode pattern 82. The MIM capacitor 80 being formed in a spiral pattern along the shapes of the first and second electrode patterns 62 and 82 results in a relatively larger capacitor region. Further, as the MIM capacitor 80 is formed over the bottom from the sidewall of the second electrode pattern 82, high capacitance is provided in a restricted planar area.

Referring to FIG. 2B, this capacitor structure according to the present invention includes first and second electrode patterns 62 and 82 shaped in fingers. The fingered first electrode pattern 62 is shaped in pluralities of lines extending along a first direction, while the fingered second electrode pattern 82 is shaped in pluralities of lines extending along a second direction contrary or opposite to the first direction. Arranging the first and second electrodes 62 and 82 with respect to each other, the linear patterns thereof are alternately disposed and an MIM capacitor 80 interposed between the first and second electrode patterns 62 and 92 is configured in a zigzag configuration in a vertical view. The MIM capacitor 80 is formed extending along the sidewall and bottom of the second electrode pattern 82, defining a hollow region filling with the second electrode pattern 82 and providing pluralities of linear portions along the pattern of the second electrode pattern 82.

Referring to FIG. 2C, this capacitor structure according to the present invention is comprised of a finger-type first electrode pattern 62 having pluralities of linear patterns, and a second electrode pattern 82 having pluralities of linear patterns arranged alternately with the linear patterns of the first electrode pattern 62. An MIM capacitor 80 is interposed between the first and second electrode patterns 62 and 82. The MIM capacitor 80 is continuously formed on the sidewall and bottom of the second electrode pattern 82, defining a hollow region filling with the second electrode pattern 82. Therefore, the MIM capacitor 80 is formed in the same configuration with the second electrode pattern 82, providing a vertically extending portion to provide high capacitance therein.

Figure 3:
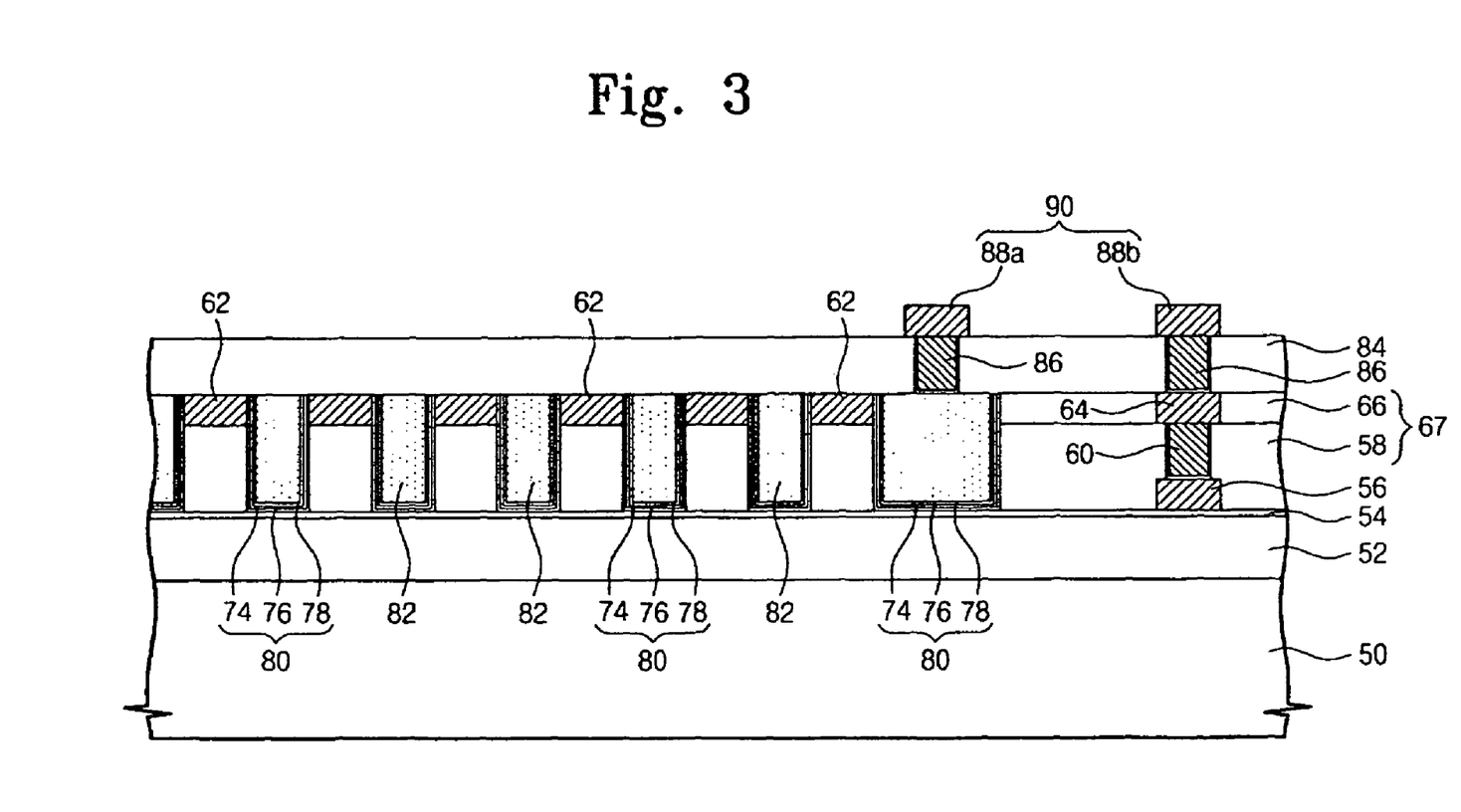
FIG. 3 is a sectional view illustrating a semiconductor device in accordance with a first embodiment of the present invention.

FIG. 3 is a sectional view illustrating a semiconductor device in accordance with a first embodiment of the present invention.

Referring to FIG. 3, an insulation film 52 is formed on a semiconductor substrate 50 and an interconnection layer 56 is formed on the insulation film 52. A, first inter-layer dielectric film 67 is formed on the insulation film 52 and the interconnection layer 56.

Under the first inter-layer dielectric film 67 may be formed an etch stop film 54. The etch stop film 54 may be formed or not in accordance with necessity.

The first inter-layer dielectric film 67 is formed of first lower and upper inter-layer dielectric films 58 and 66. On the first inter-layer dielectric film 58 is formed a first electrode pattern 62. The first electrode pattern 62 is disposed on the first lower inter-layer dielectric film 58. The first inter-layer dielectric film 67, i.e., the first lower and upper inter-layer dielectric films 58 and 66, is patterned to define a capacitor region. Here, the first inter-layer dielectric film 67 is etched being self-aligned to the first electrode pattern 62.

The MIM capacitor 80 is conformably formed on the sidewall of the first electrode pattern 62 and the capacitor region. The MIM capacitor 80 is composed of a bottom electrode 74, a capacitor dielectric film 76, and a top electrode 78. The MIM capacitor 80 is conformably formed in the capacitor region, the hollow regions in the MIM capacitor 80 being filled with the second electrode pattern 82, as shown. The second electrode pattern 82 has a sidewall opposite to the sidewall of the first electrode pattern 62. As illustrated in FIG. 3, the MIM capacitor 80 is widened in surface area because it extends along the sidewall and bottom of the second electrode pattern 82. Also, the first and second electrode patterns 62 and 82 are formed in a planar structure as shown in FIGS. 2A through 2C, maximizing a surface area of the MIM capacitor 80.

A first interconnection layer 64 is formed in a predetermined region of the semiconductor substrate 50, being at a level with the first electrode pattern 62. The first interconnection layer 64 is connected to the first electrode 62. For instance, the first interconnection layer 64 may be a pattern extending from the first electrode pattern 62.

A second inter-layer dielectric film 84 is formed all over the semiconductor substrate 50 and an upper contact pattern 86 penetrates the second inter-layer dielectric film 84. A second interconnection layer 90 is formed on the second inter-layer dielectric film 84, being connected to the first interconnection layer 64 and the second electrode pattern 82 by way of the upper contact pattern 86. The second interconnection layer 90 includes a first interconnection pattern 88a connected to the second electrode pattern 82, and a second interconnection pattern 88b connected to the first interconnection layer 64.

FIGS. 4A through 4E are sectional views illustrating a procedure of fabricating a semiconductor device according to the first embodiment of the present invention.

Figure 4A:
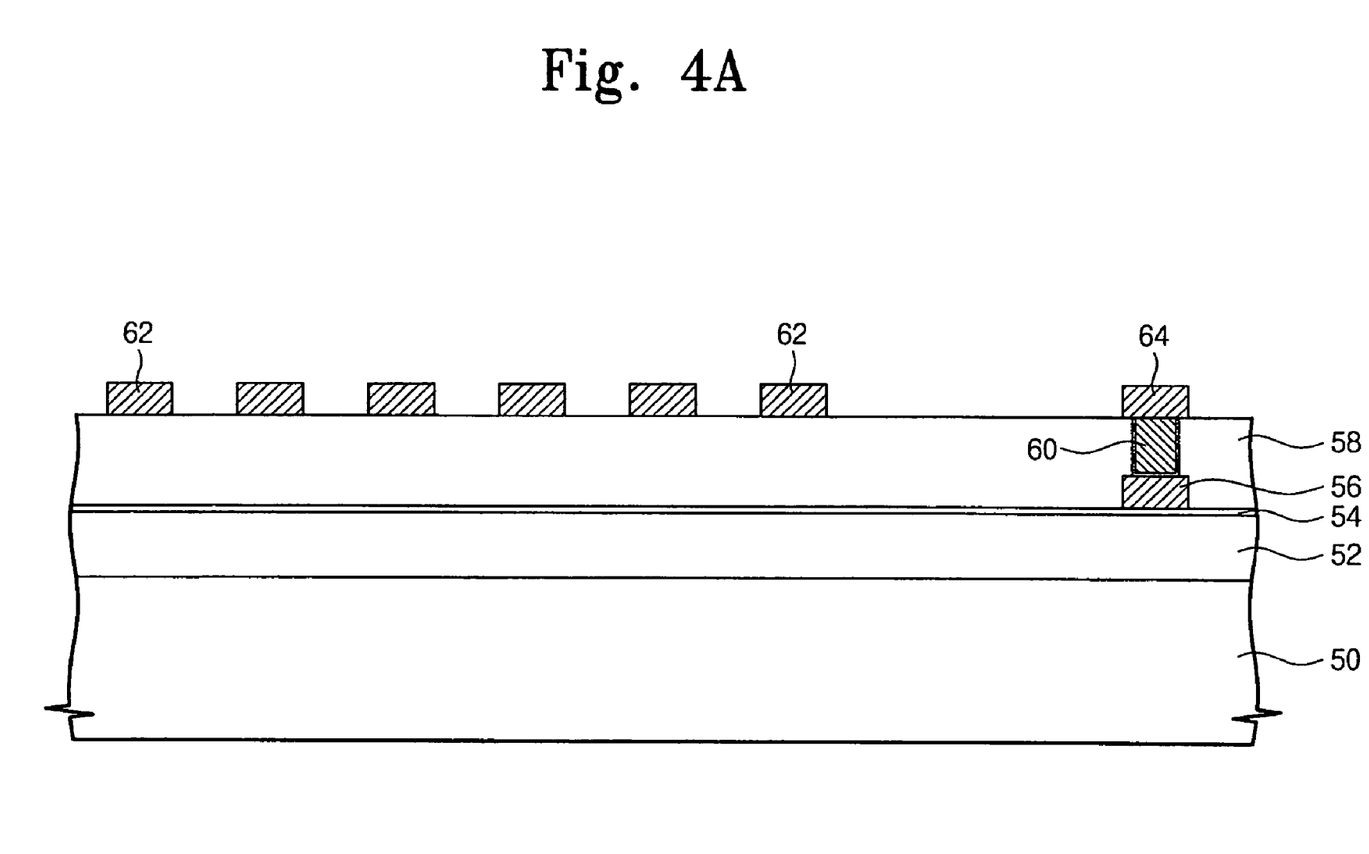
FIGS. 4A through 4E are sectional views illustrating a procedure of fabricating a semiconductor device by the first embodiment of the present invention.

First, referring to FIG. 4A, an insulation film 52 is deposited on a semiconductor substrate 50 and an interconnection layer 56 is deposited on the insulation film 52. On the insulation film 52 and the interconnection layer 56 is deposited a first, lower inter-layer dielectric film 58. Before depositing the first lower inter-layer dielectric film 58, a first etch stop film 54 may be formed under the first lower inter-layer dielectric film 58. The first etch stop film 54 is preferably made of a material with etching selectivity to the first lower inter-layer dielectric film 58.

Then, a lower contact pattern 60 is formed to penetrate the first lower inter-layer dielectric film 58. Also, a first electrode pattern 62 and a first interconnection layer 64 are formed on the first lower inter-layer dielectric film 58. That is, the first electrode pattern 62 is formed along with the interconnection layer 64 in the semiconductor device. The first electrode pattern 62 may be connected to the interconnection layer 64. The first electrode pattern 62 may be configured, for example, in the planar structure as shown in FIGS. 2A through 2C.

Figure 4B:
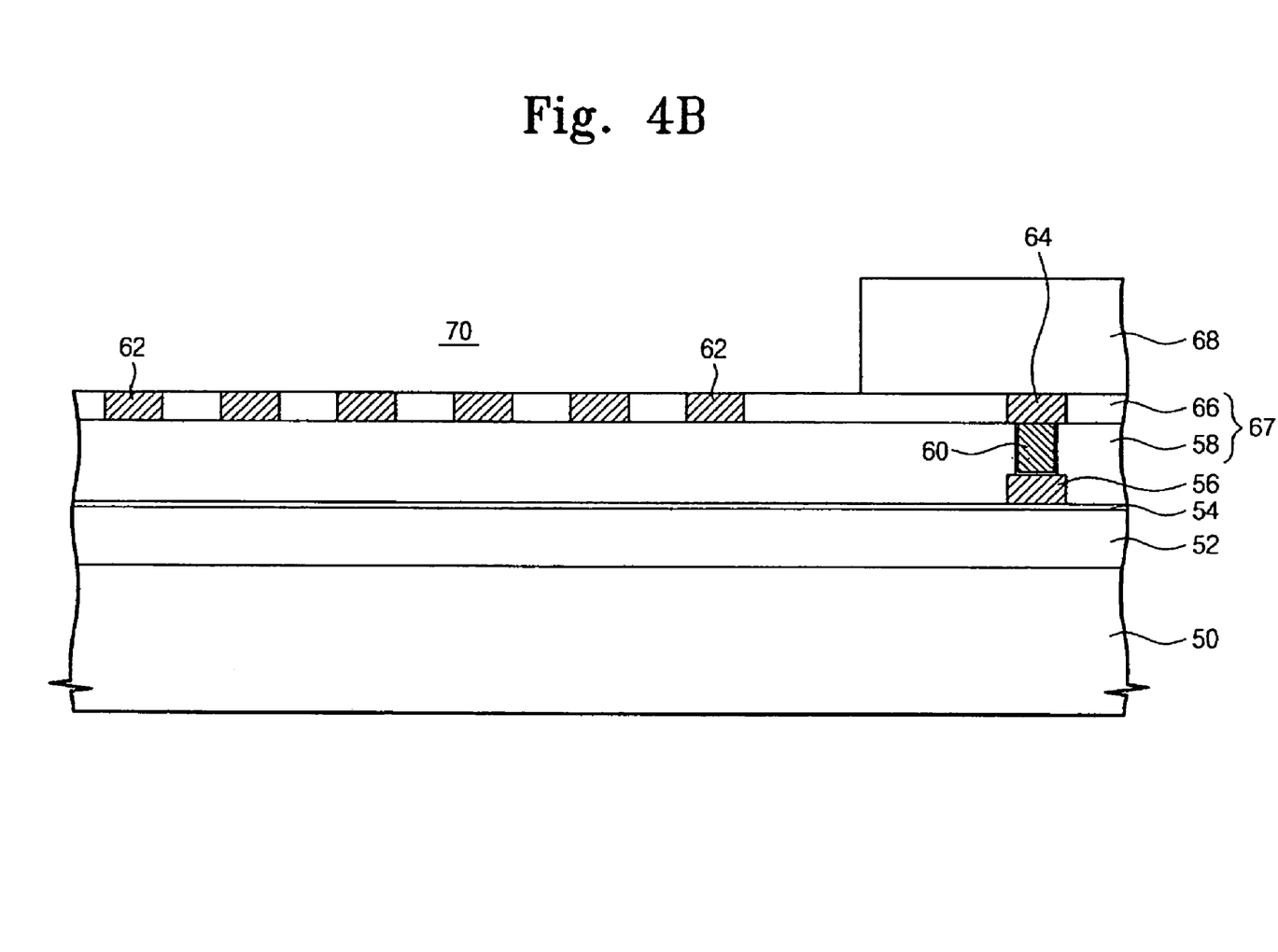

Thereafter, referring to FIG. 4B, a first upper inter-layer dielectric film 66 is deposited all over the semiconductor substrate 50. The first upper inter-layer dielectric film 66 is flattened to be arranged on the top of the first electrode pattern 62. Continuously, a photoresist pattern 68 is formed to define a capacitive region 70 on the first inter-layer dielectric film 66.

Figure 4C:
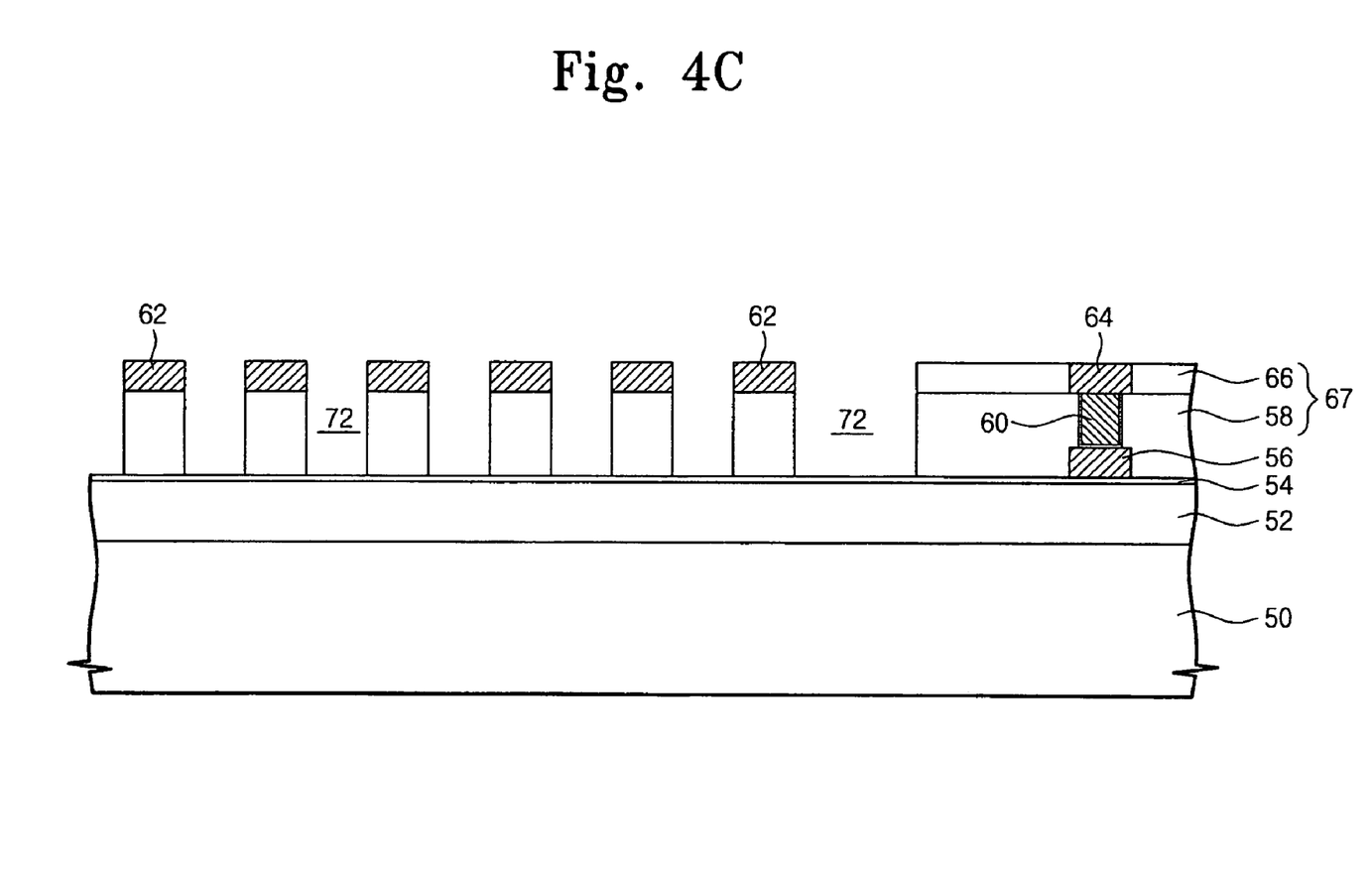

Subsequently, referring to FIG. 4C, the first inter-layer dielectric film 67 including the first upper and lower inter-layer dielectric films 66 and 58 is patterned using the photoresist pattern 68 as an etch mask. The first inter-layer dielectric film 67 may be etched until exposing the first etch stop film 54 or even etched in a predetermined depth only.

During this etching, using the first electrode pattern 62 as an etch mask and the first inter-layer dielectric film 67, i.e., the first lower inter-layer dielectric film 58, is etched with self-alignment to the first electrode pattern 62. The first inter-layer dielectric film 67 is etched to form a capacitor area 72 self-aligned to the first electrode pattern 62. Then, the photoresist pattern 68 remaining therein is removed therefrom.

Figure 4D:
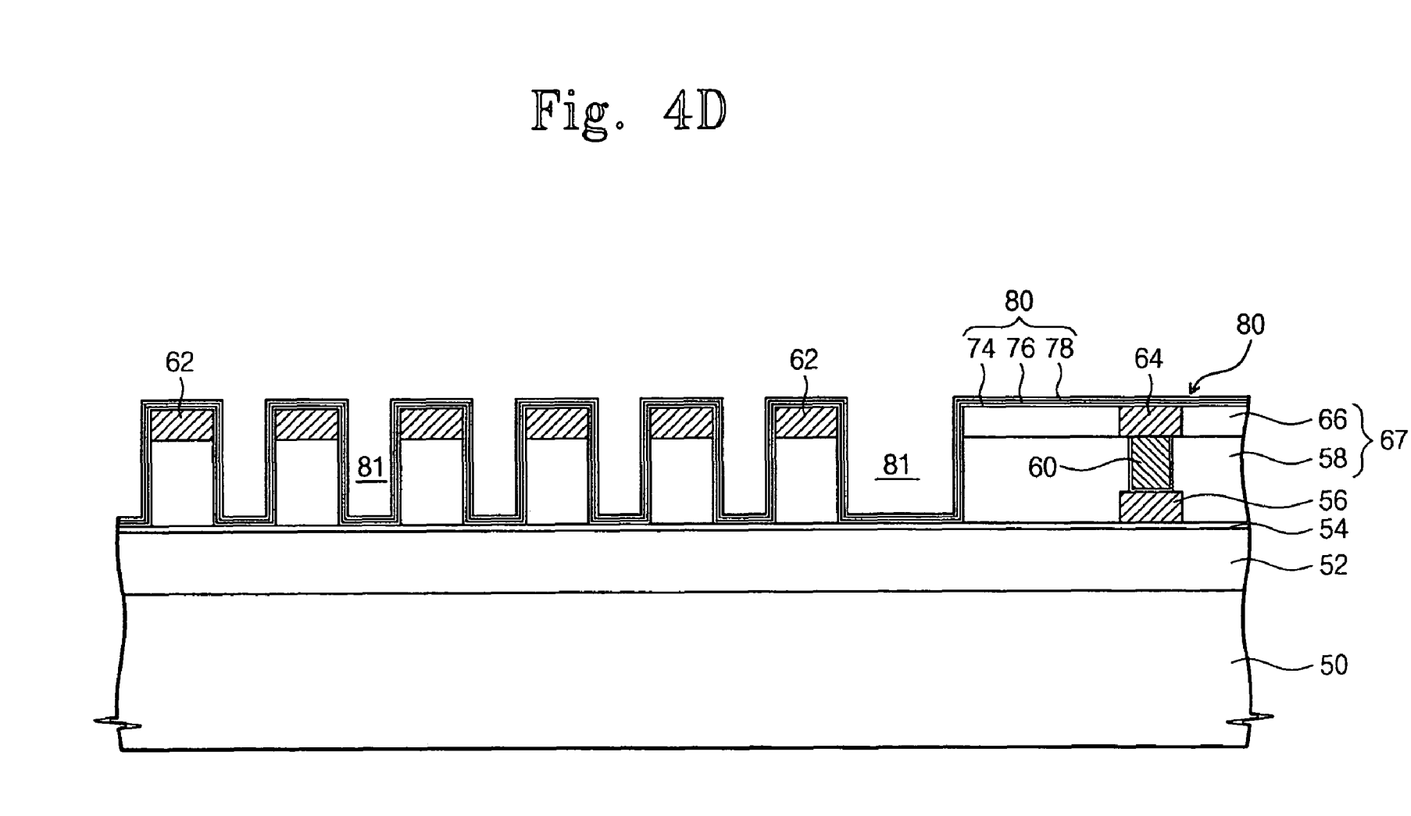

Next, referring to FIG. 4D, a bottom electrode film 74, a capacitor dielectric film 76, and a top electrode film 78 are conformably formed all over the semiconductor substrate 50. The bottom and top electrode films 74 and 78 are metallic films that may be made of a material suitable to form a thin and conformable electrode, e.g., TiN or TaN. The bottom electrode film 74, the capacitor dielectric film 76, and the top electrode film 78 compose a first MIM capacitor 80.

The first MIM capacitor 80 is conformally formed to provide the capacitor area 72 with a hollow region 81 enclosed thereby.

Figure 4E:
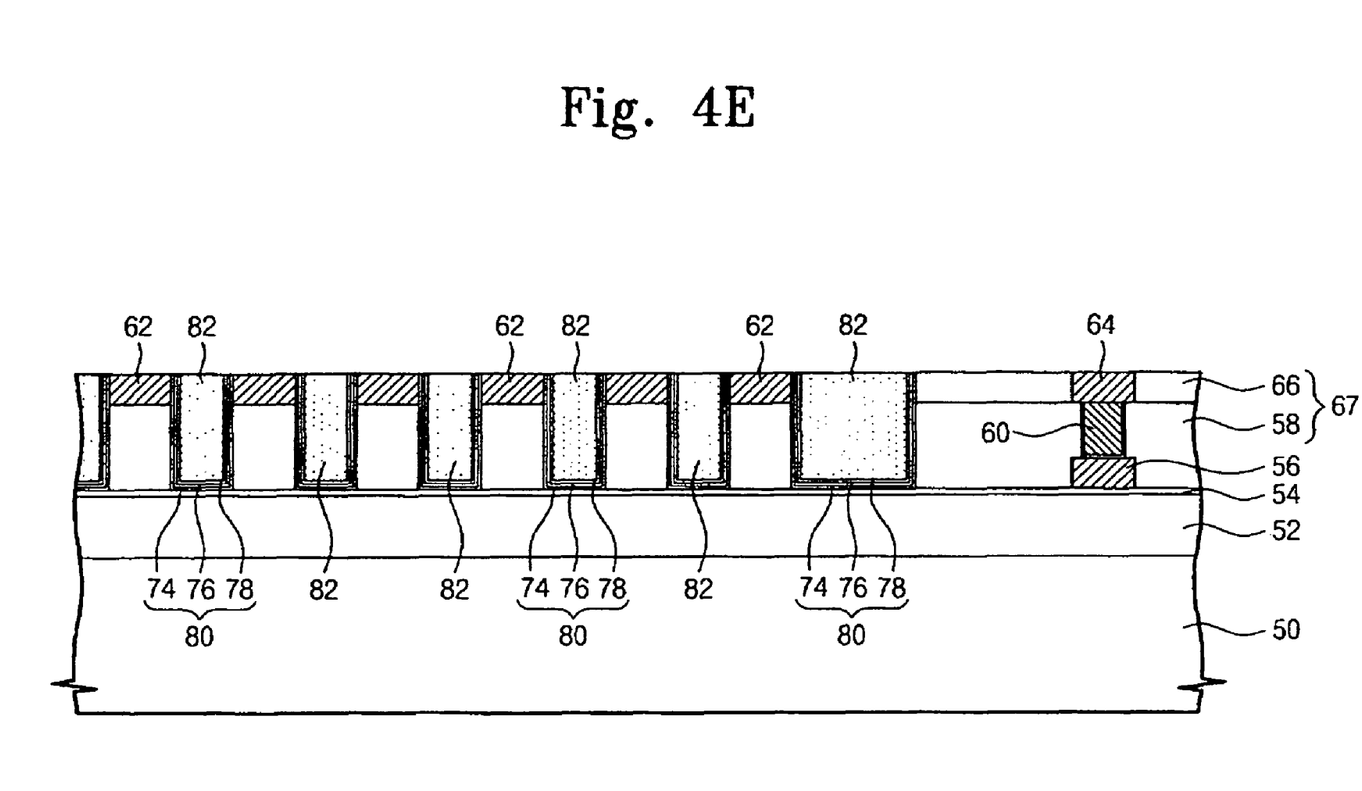

Referring to FIG. 4E, thereafter, a conductive film is deposited all over the semiconductor substrate 50, filling the hollow region 81, and then flattened to form a second electrode pattern 82 filling up the hollow region 81. During this, the conductive film and the first MIM capacitor layer on the first electrode pattern 62 and the first upper inter-layer dielectric film 66 are removed to make the first MIM capacitor 80 formed conformably on the sidewall of the first electrode pattern 62 and the sidewall and bottom of the capacitor area 72. As exemplarily shown in FIGS. 2A through 2C, the first MIM capacitor 80 is formed by extending vertically and horizontally on the semiconductor substrate 50 in the same pattern with the second electrode pattern 82. Successively, a second lower inter-layer dielectric film 84 and a second interconnection layer 90 can be formed, completing the structure shown in FIG. 3.

Figure 5:
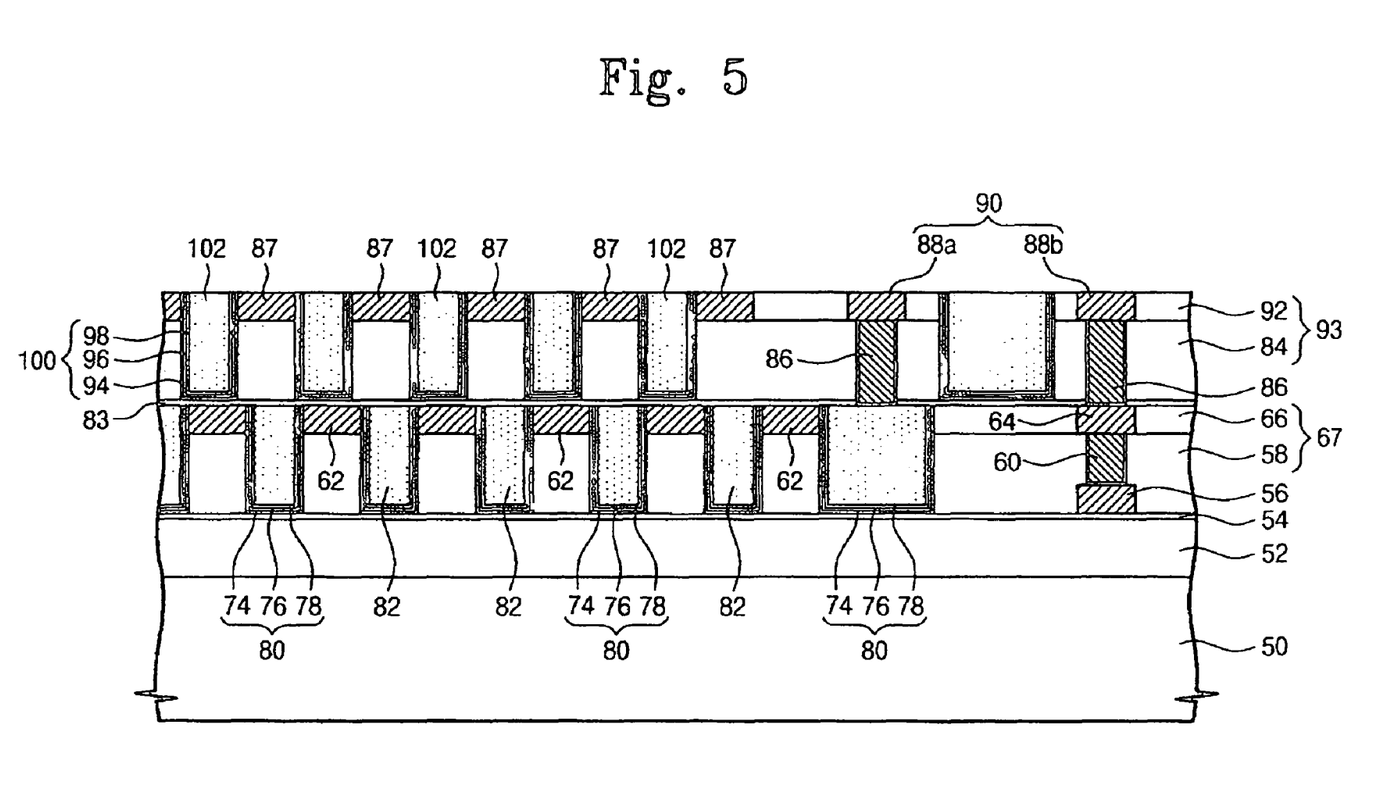
FIGS. 5 and 6 are sectional views illustrating a structure and a procedure of fabricating a semiconductor device in accordance with a second embodiment of the present invention.

FIG. 5 is a sectional view partially illustrating a semiconductor device in accordance with a second embodiment of the present invention.

Referring to FIG. 5, the semiconductor device can be configured in a stacked structure with parallel-coupled capacitors.

After forming a first MIM capacitor 80 and a second electrode pattern 82, as shown in FIG. 4, a second lower inter-layer dielectric film 84 is deposited all over a semiconductor substrate 50 and then an upper contact pattern 86 is formed, penetrating the second lower inter-layer dielectric film 84, to be connected with a first interconnection layer 64. Before forming the second lower inter-layer dielectric film 84, a second etch stop film 83 may be further formed with etch selectivity to the second lower inter-layer dielectric film 84.

On the second lower inter-layer dielectric film 84 are formed a third electrode pattern 87 and a second interconnection layer 90. The second interconnection layer 90 includes a first interconnection pattern 88a linking to the second electrode pattern 82 and a second interconnection pattern 88b linking to the first interconnection layer 64. The second interconnection pattern 88b is connected to the third electrode pattern 87. The second interconnection pattern 88b and third electrode pattern 87 may be a continual pattern.

A second upper inter-layer dielectric film 92 is deposited all over the semiconductor substrate 50 and then flattened to be aligned to the top of the third electrode pattern 87. The second lower and upper inter-layer dielectric films 84 and 92 construct a second inter-layer dielectric film 93.

Figure 6:
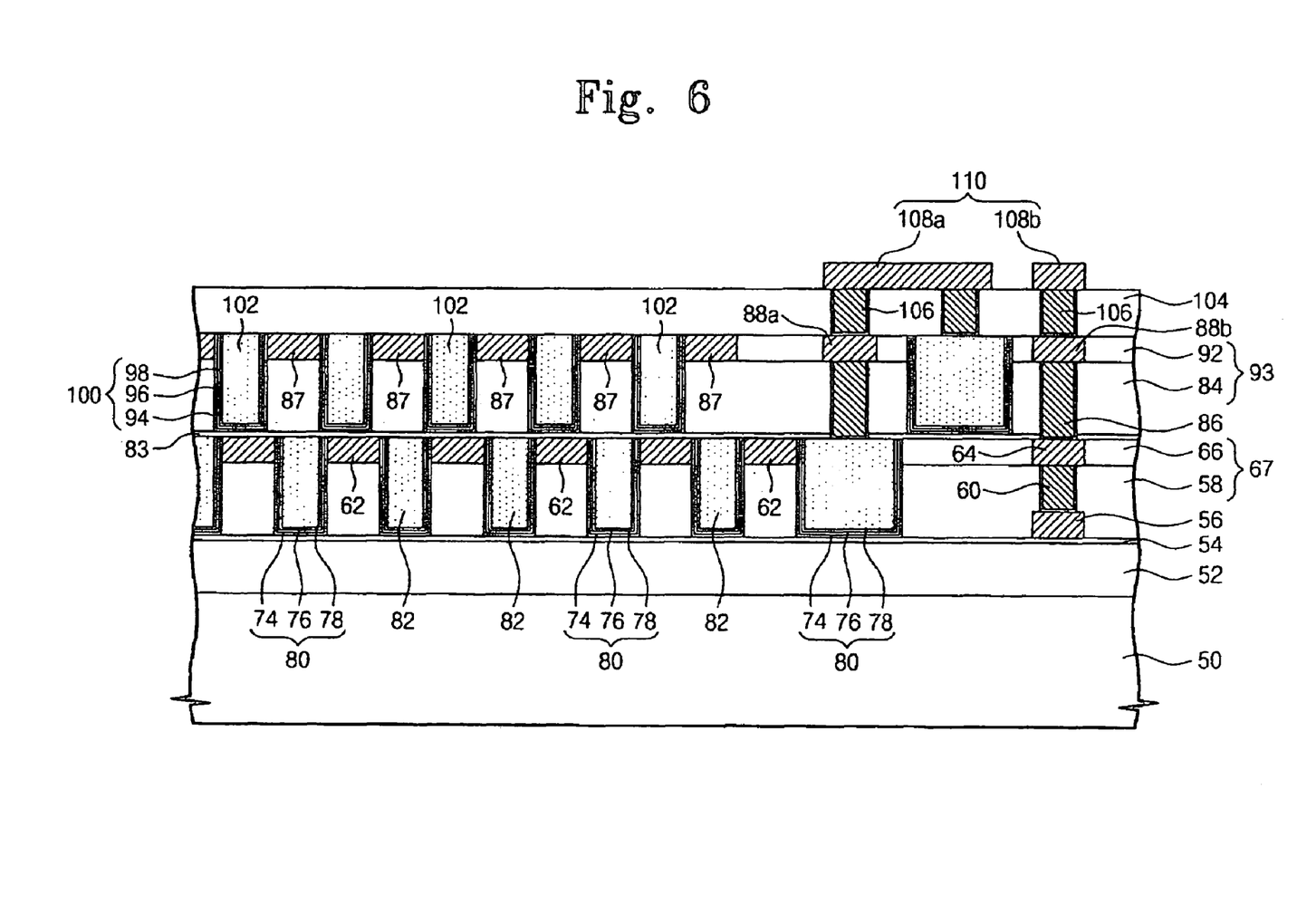

Subsequently, a second MIM capacitor 100 and a fourth electrode pattern 102 are formed by repeating a procedure similar to that used in forming the first MIM capacitor 80 and the second electrode pattern 82;

Referring to FIG. 6, a third inter-layer dielectric film 104 is deposited all over the semiconductor substrate 50 and then a contact pattern 106 is formed to penetrate the third inter-layer dielectric film 104. A third interconnection layer 110 is formed on the third inter-layer dielectric film 104. The third interconnection layer 110 includes a third interconnection pattern 108a linking with the first interconnection pattern 88a and the fourth electrode pattern 102, and a fourth interconnection pattern 108b linking with the second interconnection pattern 88b.

Thus, the first and second MIM capacitors 80 and 100 are coupled to each other in parallel. By repeating the aforementioned procedures, pluralities of parallel-coupled MIM capacitors are stacked on the semiconductor substrate 50.

The third electrode pattern 87 may be formed over the second electrode pattern 82 and the fourth electrode pattern 102 may be formed over the first electrode pattern 62. In this case, parasitic capacitance is induced between the first and fourth electrode patterns 62 and 102, and between the second and third electrode patterns 82 and 87. Thereby, it results in an increase of capacitance therein.

Figure 7:
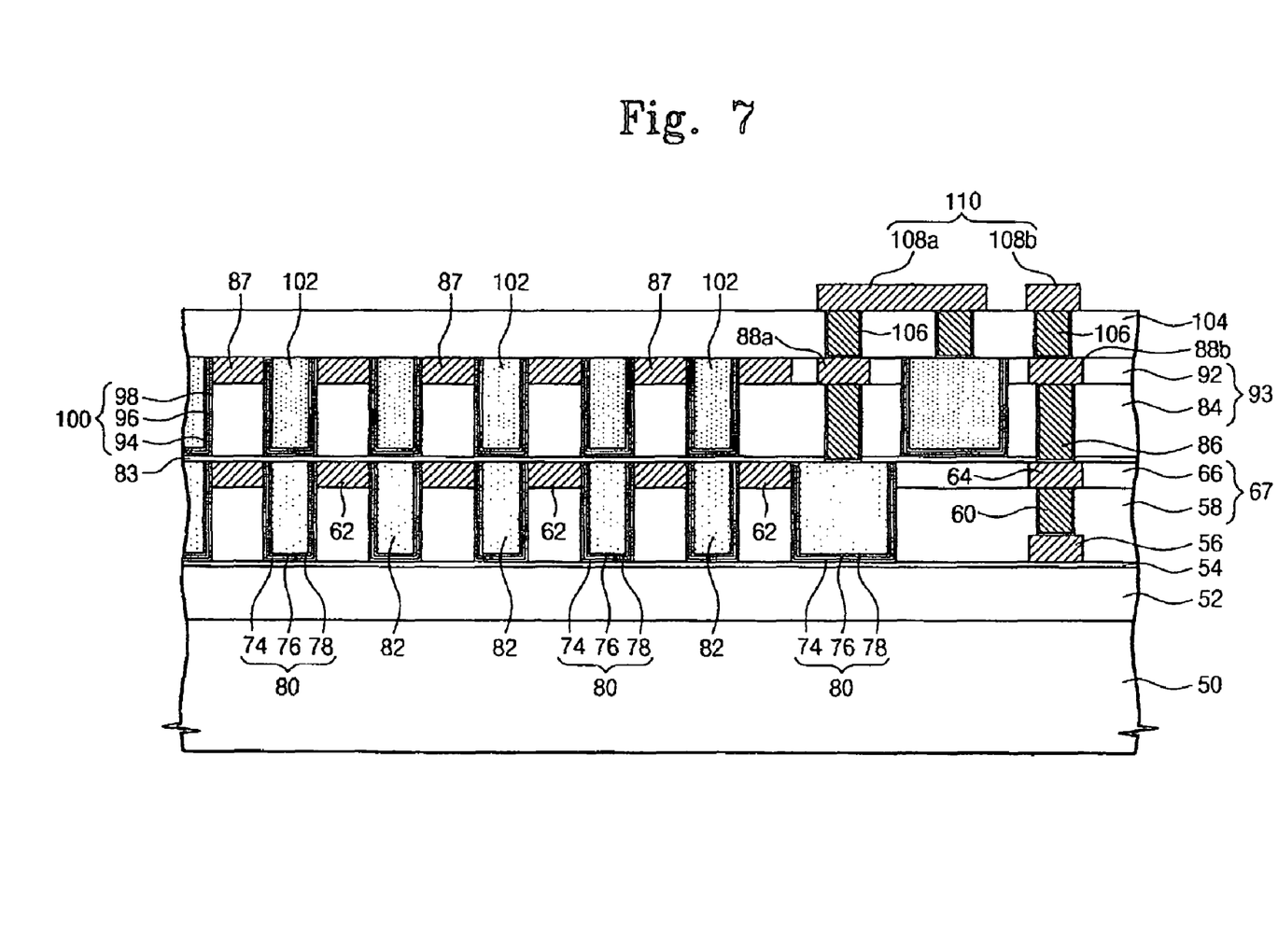
FIG. 7 is a sectional view illustrating a modification of the semiconductor device of the second embodiment of the present invention.

Otherwise, as illustrated in FIG. 7, it is permissible to form the third electrode pattern 87 over the first electrode pattern 62 and the fourth pattern 102 over the second electrode pattern 82.

As described above, according to the present invention, a first electrode pattern and an MIM capacitor with a bottom electrode contacting to the first electrode pattern are formed.

Such the MIM capacitor is conformably formed in a capacitor region deeper than an interconnection layer, resulting in a capacitive area wider than a contacting area with the interconnection layer. Further, by altering a planar configuration of an electrode pattern, an area of the MIM capacitor is enlarged.

Moreover, by increasing a thickness of the inter-layer dielectric film in which the interconnection layer is formed, a vertical area of the MIM capacitor is extended, maximizing the capacitive area thereof.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a first inter-layer dielectric film formed on a semiconductor substrate;
   a first electrode pattern formed on the first inter-layer dielectric film;
   a first capacitor region where the first inter-layer dielectric film is etched in self-alignment to the first electrode pattern;
   a first metal-insulator-metal (MIM) capacitor conformably formed on a sidewall of the first electrode pattern and the surface of the first capacitor region to form a first hollow region;
   a second electrode pattern filling the first hollow region to have sidewalls opposite to the sidewalls of the first electrode pattern;
   a first interconnection layer formed on the same level with the first electrode pattern;
   a second inter-layer dielectric film covering the first electrode pattern, the second electrode pattern, and the first interconnection layer;
   a second interconnection layer formed on the second inter-layer dielectric film;
   a third electrode pattern formed on the same level with the second interconnection layer;
   a second capacitor region where the second inter-layer dielectric film is etched in self-alignment to the third electrode pattern;
   a second MIM capacitor conformably formed on a sidewall of the third electrode pattern and the surface of the second capacitor region to define a second hollow region; and
   a fourth electrode pattern filling the second hollow region to have a sidewall opposite to a sidewall of the third electrode pattern.

2. The semiconductor device of claim 1, wherein the first MIM capacitor comprises a bottom electrode, a capacitor dielectric film, and a top electrode,
   wherein the bottom electrode is connected to the first electrode pattern and the top electrode is connected to the second electrode pattern.

3. The semiconductor device of claim 1 further comprising:
   a first etch stop film formed under the first inter-layer dielectric film, having an etch selectivity to the first inter-layer dielectric film,
   wherein the first MIM capacitor contacts with the first etch stop film through the first inter-layer dielectric film.

4. The semiconductor device of claim 1, wherein the first inter-layer dielectric film comprises a first lower inter-layer dielectric film and a first upper inter-layer dielectric film,
   wherein the first electrode pattern is formed on the first lower inter-layer dielectric film, and the first upper inter-layer dielectric film is formed on the first lower inter-layer dielectric film and flattened in alignment to the top surface of the first electrode pattern.

5. The semiconductor device of claim 1, wherein in a vertical view to the semiconductor substrate, the first MIM capacitor is interposed between the first electrode pattern and the second electrode pattern engaging each other.

6. The semiconductor device of claim 5, wherein in a vertical view to the semiconductor substrate, the first electrode pattern and the second electrode pattern are configured in plural fingers extending in parallel in linear forms, the fingers of the first electrode pattern and the second electrode pattern being alternately arranged and opposite to each other.

7. The semiconductor device of claim 5, wherein in a vertical view to the semiconductor substrate, the first electrode pattern is configured in plural fingers bidirectionally extending in linear forms, and the second electrode pattern is configured in pluralities of lines alternately arranged with the fingers of the first electrode pattern.

8. The semiconductor device of claim 5, wherein on a vertical view to the semiconductor substrate, the first and second electrode patterns are configured in spiral forms extending in parallel.

9. The semiconductor device of claim 1, wherein the first interconnection layer is connected to the first electrode pattern,
   wherein the second interconnection layer comprises a first interconnection pattern connected to the first interconnection layer, and a second interconnection pattern connected to the second electrode pattern.

10. The semiconductor device of claim 1, wherein the first and second MIM capacitors are connected to each other in parallel.

11. The semiconductor device of claim 10 further comprising:
    a third inter-layer dielectric film covering the third electrode pattern, the fourth electrode pattern and the second interconnection layer; and
    a third interconnection layer formed on the third inter-layer dielectric film.

12. The semiconductor device of claim 11, wherein the first interconnection layer is connected to the first electrode pattern,
    wherein the second interconnection layer includes a first interconnection pattern connected to the first interconnection layer and the third electrode pattern, and a second interconnection pattern connected to the second electrode pattern, wherein the third interconnection layer includes a third interconnection pattern connected to the first interconnection pattern, and a fourth interconnection pattern connected to the fourth electrode pattern and the second interconnection pattern.

13. The semiconductor device of claim 1, wherein the third electrode pattern is placed over the second electrode pattern and the fourth electrode pattern is placed over the first electrode pattern.

14. The semiconductor device of claim 1, wherein the third electrode pattern is placed over the first electrode pattern and the fourth electrode pattern is placed over the second electrode pattern.

15. The semiconductor device of claim 1 further comprising:
a second etch stop film formed under the second inter-layer dielectric film, having etch selectivity to the second inter-layer dielectric film,
wherein the second MIM capacitor contacts with the second etch stop film through the second inter-layer dielectric film.

16. The semiconductor device of claim 1, wherein the first inter-layer dielectric film comprises first lower and upper inter-layer dielectric films while the second inter-layer dielectric film comprises second lower and upper inter-layer dielectric films,
wherein the first and third electrode patterns are formed respectively on the first and second lower inter-layer dielectric films while the first and second upper inter-layer dielectric films are flattened in alignment each to the tops of the first and third electrode patterns.

17. A method of fabricating a semiconductor device, comprising:
forming a first inter-layer dielectric film on a semiconductor substrate;
forming a first electrode pattern on the first inter-layer dielectric film;
etching the first inter-layer dielectric film in self-alignment with the first electrode pattern to form a first capacitor region;
conformably forming a first metal-insulator-metal (MIM) capacitor on a sidewall of the first electrode pattern and the surface of the first capacitor region, wherein the first MIM capacitor defines a first hollow region;
forming a second electrode pattern to fill the first hollow region, wherein the second electrode pattern includes a sidewall opposite to the sidewall of the first electrode pattern;
forming a second inter-layer dielectric film on a surface of the semiconductor substrate after forming the second electrode pattern;
forming a second interconnection layer on the second inter-layer dielectric film, the second interconnection layer penetrating the second inter-layer dielectric film and being connected to a first interconnection layer and the second electrode pattern;
forming a third electrode pattern on the second inter-layer dielectric film at the same time with forming the second interconnection layer;
etching the second inter-layer dielectric film in self-alignment to the third electrode pattern and forming a second capacitor region;
conformably forming a second MIM capacitor on a sidewall of the third electrode pattern in the second capacitor region and defining a second hollow region; and
forming a fourth electrode pattern to fill the second hollow region and include a sidewall opposite to the sidewall of the third electrode pattern.

18. The method of claim 17, wherein forming the first MIM capacitor comprises:
conformably forming an first MIM capacitor layer on a surface of the semiconductor substrate including the first capacitor region, the first MIM capacitor layer defining the first hollow region;
forming a second electrode pattern film filled in the first hollow region on the first MIM capacitor layer; and
removing the second electrode pattern film and the first MIM capacitor layer on the first inter-layer dielectric film and the first electrode pattern.

19. The method of claim 17, wherein forming the first inter-layer dielectric film comprises:
forming a first lower inter-layer dielectric film before forming the first electrode pattern;
forming a first upper inter-layer dielectric film covering the first electrode pattern and the first lower inter-layer dielectric film; and
flattening the first upper inter-layer dielectric film to align with the top surface of the first electrode pattern.

20. The method of claim 19 further comprising:
simultaneously with forming the first electrode pattern, forming the first interconnection layer electrically connected to the first electrode pattern on the first lower inter-layer dielectric film.

21. The method of claim 19 further comprising:
forming a first etch stop film having etch selectivity to the first inter-layer dielectric film before forming the first inter-layer dielectric film.

22. The method of claim 21 further comprising:
etching the first inter-layer dielectric film and exposing the first etch stop film while forming the first capacitor region.

23. The method of claim 17 wherein the second interconnection layer includes a first interconnection pattern connected to the first interconnection layer, and a second interconnection pattern connected to the second electrode pattern.

24. The method of claim 17 further comprising:
forming a third inter-layer dielectric film covering the third electrode pattern, the fourth electrode pattern, and the second interconnection layer; and
forming a third interconnection layer on the second inter-layer dielectric film,
wherein the third interconnection layer includes a third interconnection pattern connected to the first interconnection pattern, and a fourth interconnection pattern connected to the fourth electrode pattern and second interconnection pattern.

* * * * *